Feb. 25, 1969 W. B. HARRIS 3,430,074

VARIABLE WIDTH PULSE CIRCUIT

Filed March 22, 1967

INVENTOR
W. B. HARRIS
BY
Walter M. Hill
ATTORNEY

United States Patent Office
3,430,074
Patented Feb. 25, 1969

3,430,074
VARIABLE WIDTH PULSE CIRCUIT

William B. Harris, Bernardsville, N.J., assignor to Bell Telephone Laboratories, Incorporated, Murray Hill and Berkeley Heights, N.J., a corporation of New York
Filed Mar. 22, 1967, Ser. No. 625,225
U.S. Cl. 307—265 8 Claims
Int. Cl. H03k *1/18, 3/28*

ABSTRACT OF THE DISCLOSURE

A variable width pulse circuit employing only two thyristor switch circuits, one for turning the pulse ON and a second one for turning the pulse OFF. A single resonant turn-off circuit, including two capacitors and a transformer, is used for automatically opening both switch circuits after the second switch circuit has turned the pulse OFF.

*Background of the invention*

This invention relates to electrical switching circuits employing solid state switching devices and in particular to such circuits for generating electrical pulses of variable width.

Pulse generators are used for a great variety of purposes in the electrical arts. These uses range from pulse modulators and television deflection circuits to automobile ignition systems. In recent years considerable effort has been expended toward the development of pulse generators suitable for high speed modulation of high power pulse communication systems including radar systems. In some cases it is essential that the pulses be of variable but precise widths, that is, they exist for variable, precise periods of time. In most of these applications it is also required that they be of substantially square waveform. This requires that they have extremely rapid rise and fall characteristics extending overtime periods in the order of only one or two microseconds. To meet these difficult requirements, solid state switches are a necessity because of their inherently high operating speeds. However, the resulting pulse circuits have become quite complex notwithstanding the higher speed capability of the solid state devices. In all prior art solid state variable width pulse circuits known to applicant which are capable of operating at the high speeds mentioned above, at least three solid state switch devices have been necessary to provide adequate performance. This is particularly true where the normally resistive load also contains some capacitance. To improve circuit reliability, as well as to reduce cost, it is imperative that the circuit be made as simply as possible. Applicant is aware that two switches have worked quite satisfactorily in circuits used as interval timers in slow speed applications, that is, applications operating in the millisecond range. However, applicant does not know of any of such circuits that are capable of satisfactory operation in the microsecond range. An example of a two-switch interval timer operating in the millisecond range is disclosed in an article by C. I. Bradford beginning on page 28 of the November 1940 issue of Electronics. This circuit employs thyratrons which, because of their relatively slow ionization and deionization times, are incapable of operation in the microsecond range. Merely substituting two solid state switching devices for these thyratrons will not result in a circuit capable of meeting the high speed performance requirements of present day high power pulse communication systems and applicant is not aware that any prior attempt to achieve satisfactory performance with only two switches has proved successful.

*Summary of the invention*

The present invention is directed to a variable width pulse circuit comprising two thyristors, one of which connects a direct voltage source in series with a pair of output terminals to which a suitable load may be connected. The pulse thus applied to the load is thereafter promptly terminated by the operation of the second switch which is connected across the output terminals in series with a suitable impedance means. Both switch circuits are closed in timed sequence by a control circuit and, after the second switch is closed, both switches are automatically reopened by a resonant turn-off circuit comprising a two-winding transformer having one winding connected in series with a capacitor across one of said switches while the other winding is similarly connected in series with a second capacitor across the other switch circuit.

*Brief description of the drawings*

The invention may be better understood by reference to the accompanying drawings, in which.

*Detailed description*

Figure 1:
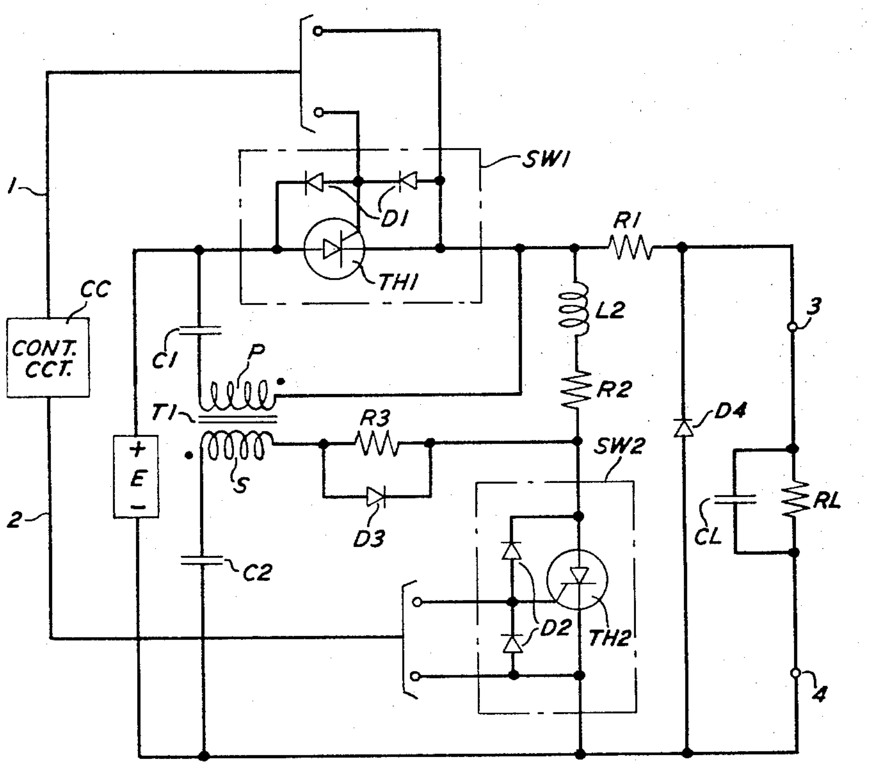
FIG. 1 discloses the essential features of the invention applied to a pulse modulator.

Referring to FIG. 1, a source of direct voltage E is connected in series with output terminals 3 and 4 through a thyristor switch circuit SW1. A suitable load, which may have a resistance RL and capacitance CL, may be connected to the output terminals 3 and 4. When switch SW1 is closed, current will flow from the direct voltage source E, through the switch, through a small series resistor R1 and through the load by way of output terminals 3 and 4. While the resistance of resistor R1 is not critical, it should be small compared to the load impedance. Current through this load may be abruptly terminated by subsequently closing switch SW2, thereby placing a low impedance shunt across the output terminals. As shown in FIG. 1, switch SW2 is connected across the output terminals 3, 4 through a series resistor R2 and inductor L2. Switches SW1 and SW2 are operated in sequence by pulses obtained over circuit paths 1 and 2 from a control circuit CC. Switch SW1 is turned ON by a pulse from the control circuit arriving by way of circuit path 1 and applied between the gate and cathode terminals of thyristor TH1. While switch SW1 is shown to have two diodes D1 connected in the manner shown, this switch circuit may, alternatively, be of the conventional type shown in FIG. 2 of an article by Messrs. R. Dunn and J. Wood appearing on page 470 of Electronic Engineering for July 1963. The circuit shown for switch SW1, however, is preferred because of its higher speed capability and is more fully described in the copending application of W. B. Harris, R. P. Massey and F. J. Zgebura, Ser. No. 537,544, filed Mar. 25, 1966 and assigned to the same assignee as the present application. Since it is not essential to a complete understanding of the present invention that the operation of this improved switch be fully understood, further description thereof is unnecessary. It need only be known that when a pulse is applied between the gate and cathode terminals of thyristor TH1, this thyristor will immediately turn ON and will remain ON until a turn-off circuit forces a reverse current through the thyristor to make it recover. Recovery of the switch described in the above-mentioned publication is accomplished by a reverse current coming from a series-resonant circuit connected across the switch and this mode of operation is broadly the same as that occurring in the present case as will be more fully described later.

Switch SW2 may be of the same type as switch SW1 and it is caused to similarly turn ON by a control pulse arriving over circuit path 2 and applied between the gate and cathode terminals of thyristor TH2. A transformer T1 having two windings with an equal number of turns has its primary winding P connected in series with capacitor C1 across the first switch SW1. The secondary winding S of this transformer is similarly connected in series with capacitor C2 and across switch SW2 in series with a parallel network comprising a resistor R3 and a diode D3 poled as shown. An additional diode D4 is connected directly across the output terminals 3 and 4.

Transformer T1 and its associated capacitors C1 and C2 comprise a novel resonant turn-off circuit for both switches. This resonant circuit and its associated devices comprising resistor R3, diode D3, resistor R2, inductor L2, resistor R1 and diode D4 cooperate in a unique manner to force a very rapid recovery of both switches, thereby making it possible to provide a pulse of good square waveform with only two switches. The operation of this circuit will now be described with reference also being made to the typical waveform shown in FIG. 2.

A cycle of operation may being with both switches open in which case capacitor C1 is charged to the voltage of source E by current flowing from the positive terminal of source E into the capacitor C1 through the primary winding P, resistor R1 and back to the source by way of resistance RL. When a control pulse arrives over circuit path 1, switch SW1 is promptly turned ON to initiate a pulse across the load through a circuit path from the positive terminal of source E, through thyristor TH1, resistor R1, the load connected to terminals 3 and 4 and back to the negative terminal of source E. The instant that the thyristor switch SW1 is closed, capacitor C1 starts to discharge through the primary winding P of transformer T1 and thyristor TH1. The discharge will be in such a direction as to induce a current in the secondary winding S positive at its dotted end, thereby causing capacitor C2 to charge through resistor R3 and the two diodes D2 of switch SW2, it being noted that the current flow caused by this induced voltage is in the forward direction for these two diodes. Ordinarily the current flow induced in the secondary winding S will not fully charge capacitor C2 to the potential of source E and when this current flowing through diodes D2 becomes less than the current that can flow from source E through switch SW1, inductor L2 and resistor R2, the diodes D2 become reverse biased so that the charge on capacitor C2 is now brought to the potential of source E by current continuing to flow through switch SW1, inductor L2, resistor R2, R3 and the secondary winding S. It will now be apparent that, by merely closing switch SW1, the charge on capacitor C1 is effectively transferred to capacitor C2 and the circuit remains in this stable condition so long as switch SW2 is not closed.

Figure 2:
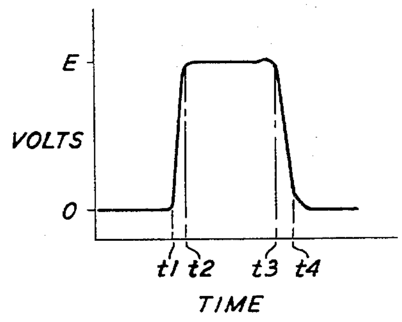
FIG. 2 discloses a typical pulse characteristic of the pulse provided by the circuit of FIG. 1.

Referring now to FIG. 2, the pulse was initiated at the instant *t*1 when switch SW1 was closed. A very short period thereafter, at time *t*2, the voltage across output terminals 3 and 4, and thus across the load RL, CL, has reached essentially that of source E. As shown in FIG. 2, this voltage will remain essentially constant until the instant *t*3 when switch SW2 is closed by a pulse arriving over circuit path 2 from the control circuit CC. It may be noted that there is a slight rise in voltage in the region of the turn-off time *t*3. This is a transient effect which is of no practical concern insofar as the present invention is concerned.

When switch SW2 is closed as described above, the pulse is terminated. The closure of this switch causes capacitor C2 to discharge through secondary winding S, diode D3 and switch SW2 thereby starting a ringing current which recharges capacitor C1 by inducing current in primary winding P which flows in the reverse direction through thyristor TH1 of switch SW1. This reverse current causes thyristor TH1 to open after which the reverse current continues by way of diodes D1 to continues to charge capacitor C1. As previously stated, the network comprising capacitor C1, C2 and transformer T1 is resonant so that as the next half cycle of current starts in the primary circuit, the sum of the currents from source E and the ringing current from capacitor C1 opens diodes D1 because of reverse biasing, thereby leaving most of the charge of the original polarity trapped on capacitor C1. If capacitor C1 is not fully charged to the voltage of source E, it will complete its charge from source E through the same circuit initially described. As a design requirement, it may be mentioned that the turn-off current induced in the primary winding P must be greater than the sum of the currents from source E flowing through the load and inductor L2 or thyristor TH1 will not be turned off.

When switch SW1 opens, the field which had been built up in inductor L2 starts to fall rapidly, thereby inducing an electromotive force in its windings which aids the voltage charge on capacitance CL of the load. This results in a current continuing in the forward direction through switch SW2, the load RL, CL and resistor R1 to force a rapid discharge of the load capacitance CL, thereby bringing the pulse across the load to an abrupt zero. The resulting load voltage is represented by that portion of the waveform of FIG. 2 existing in the time interval between instants *t*3 and *t*4. This interval, as well as the interval between *t*1 and *t*2, may be in the order of only one or two microseconds. So long as any charge exists on the load capacitance CL, diode D4 is held in a back biased condition, but as current from inductor L2 continues through switch SW2 it will start to reverse the charge in load capacitance CL. This will cause diode D4 to promptly begin conduction and hold the voltage close to zero. As switch SW1 is now open, the ringing current path through the primary winding P is open circuited. This leaves only capacitor C2 and the leakage inductance of secondary winding S to continue to ring through its second half cycle. As this second half cycle starts, diode D3 is opened so the second half cycle of ringing current is promptly reduced by reason of the effective insertion of resistor R3. This latter current constitutes a reverse current component through switch SW2. When the discharge current from inductor L2 becomes less than this reverse ringing current, thyristor TH2 is forced to recover, thereby permitting capacitor C2 to complete its second half cycle through the two diodes D2. When the third half cycle of this ringing circuit starts, its current, added to any still coming from inductor L2, back biases diodes D2 to promptly cause them to open. The cycle is now complete and the modulator circuit is ready to start another pulse which may be initiated by current from circuit path 1 to switch SW1. Since the width of the pulse is under control of the pulses from control circuit CC, it may be varied as desired by changing the time interval between the control pulses. Typically, the pulse width may be varied with ease over a range from 10 to 600 microseconds.

Although the invention has been illustrated as having only one thyristor in each of the two switches SW1 and SW2, these switches may each comprise a series string of thyristors to meet high voltage requirements. Since series switch strings are well known in this art, a more detailed description is unnecessary. Also, wherever necessary to meet voltage requirements, the several diodes shown in FIG. 1 may actually comprise a plurality of diodes connected in series. The invention has also been described as having a transformer T1 with equal windings in which case capacitors C1 and C2 should have approximately equal capacitance. This relationship, although desirable, is not necessarily essential and the transformer may have windings with an unequal number of turns and capacitors C1 and C2 may correspondingly be of unequal capacitance. These and other modifications and substitutions may become apparent to those skilled in this art and may be made without departing from the scope of the invention.

What is claimed is:

1. A variable width pulse circuit comprising first and second thyristor switch circuits, a source of direct voltage, a pair of output terminals to which a load circuit may be connected, means connecting the first of said switch circuits in series with said source and said output terminals to develop a pulse across said output terminals when said first switch circuit is closed, means connecting said second switch circuit across said output terminals to terminate said pulse when said second switch circuit is closed, means connected to said switch circuits to close them in timed sequence, and a resonant circuit means to automatically open both switch circuits, said resonant circuit means comprising a transformer having two windings, a capacitor connected in series with one of said windings and the first of said switch circuits and a second capacitor connected in series with the other of said windings and said second switch circuit.

2. The combination of claim 1 wherein said means connecting the first of said switch circuits comprises a resistor having a resistance small relative to the load impedance.

3. The combination of claim 1 wherein the means connecting said second switch circuit comprises an inductor.

4. The combination of claim 1 wherein the two windings of said transformer have an equal number of turns and said two capacitors are of substantially equal capacitance.

5. The combination of claim 1 and a network connected in series with said second capacitor and said second switch circuit, said network comprising a resistor connected in parallel with a diode.

6. A variable width pulse circuit having one means connecting a first thyristor switch circuit in series with a direct voltage source and a load circuit to supply a pulse to said load circuit, another means including an inductor connecting a second thyristor switch circuit across said load circuit to terminate said pulse, a means for closing said two switch circuits in timed sequence and a means for automatically opening each of said switch circuits promptly after closure of said second switch circuit, characterized in that said means for automatically opening said switch circuits comprises a transformer having two windings, a first capacitor with means connecting it in series with one of said windings and one of said switch circuits and a second capacitor with means connecting it in series with the other of said windings and said second switch circuit.

7. The combination of claim 6 wherein the two windings of said transformer have an equal number of turns and said two capacitors are of substantially equal capacitance.

8. The combination of claim 6 wherein said means connecting said second capacitor includes a network connected in series with said second capacitor and said second switch circuit, said network comprising a resistor connected in parallel with a diode.

References Cited

UNITED STATES PATENTS

| | | | |
|---|---|---|---|
| 3,174,096 | 3/1965 | Lichowsky | 307—252 X |
| 3,303,356 | 2/1967 | Bell | 307—265 X |
| 3,324,313 | 6/1967 | Soroka | 307—284 |
| 3,334,247 | 8/1967 | Hodges | 307—267 |

JOHN S. HEYMAN, *Primary Examiner.*

U.S. Cl. X.R.

307—268, 284